United States Patent [19]

Naokawa

[11] 4,219,781
[45] Aug. 26, 1980

[54] TRANSISTOR AMPLIFIER CIRCUIT

[75] Inventor: Toyoziro Naokawa, Sakado, Japan

[73] Assignee: Toko Kabushiki Kaisha, Tokyo, Japan

[21] Appl. No.: 960,556

[22] Filed: Nov. 14, 1978

[30] Foreign Application Priority Data

Nov. 24, 1977 [JP] Japan ................. 52-139925

[51] Int. Cl.³ .................... H03F 3/45; H03G 3/00
[52] U.S. Cl. ........................ 330/254; 330/255; 330/257
[58] Field of Search ............... 330/254, 255, 257; 358/27

[56] References Cited

U.S. PATENT DOCUMENTS

| | | | |
|---|---|---|---|
| 3,891,937 | 6/1975 | Bockelmann et al. | 330/254 |
| 3,987,368 | 10/1976 | Ahmed | 330/257 |

*Primary Examiner*—James B. Mullins
*Attorney, Agent, or Firm*—Wenderoth, Lind & Ponack

[57] ABSTRACT

A gain control transistor amplifier circuit employing as a double balance type cascade amplifier comprises two differential amplification stages. Current mirror circuits are provided for the respective stages for applying the outputs of these stages to a constant current source circuit. A resistor and a DC stabilization voltage source are connected to the output stage of the latter current mirror circuit, thereby obtaining an output which is stable irrespective of the gain control operation thereof.

4 Claims, 2 Drawing Figures

TRANSISTOR AMPLIFIER CIRCUIT

BACKGROUND OF THE INVENTION

This invention relates to a differential amplifier circuit, and more particularly to a gain control circuit utilizing a double balance type cascade amplifier circuit and to a differential amplifier circuit in which the operating point of a gain control transistor and the DC potential of its output are stable at all times irrespective of the gain control operation.

A typical conventional differential amplifier circuit having a gain control functions is shown in FIG. 1. The gain control operation of the differential amplifier circuit is carried out by varying the DC emitter currents of transistors 1 and 2, i.e., the collector current of transistor 3 employed as a constant current source by means of a variable voltage source 8. In other words, an increase in the collector current of the transistor 3 decreases the emitter resistance of the transistors 1 and 2 in the input differential amplification stage. In such an ordinary differential amplifier circuit, in order to obtain a voltage gain control range of 20 dB for instance, it is necessary to change the emitter current by a factor of ten. Accordingly, in the case where the collector load of the transistors 1 and 2 is a resistance load, the resistance is, in general, several hundred ohms to 1 KΩ. Therefore, in general, the DC potential variation of the output reaches several volts or higher.

As was described above, in the conventional differential amplification circuit, the DC potential of the output is varied by the gain control operation. Therefore, in the case where the conventional differential amplification circuit is manufactured in the form of an integrated circuit, it is very difficult to design a circuit to be connected to the next stage. In addition, the amplitude-frequency characteristic of the output signal also varies in an amplification stage having a gain control function.

SUMMARY OF THE INVENTION

Accordingly, an object of this invention is to eliminate all of the above-described difficulties accompanying a conventional differential amplification circuit by providing an output circuit utilizing a current mirror circuit.

Another object of the invention is to provide a double balance type cascade amplifier which has an automatic gain control function and can be readily manufactured in the form of an integrated circuit.

A further object of the invention is to provide a double balance type cascade amplifier in which the output is stable over a wide range of gain controlled by an automatic gain control, which continues in operation even if the supply voltage is reduced to a very low value.

A still further object of the invention is to provide a double balance type cascade amplifier whose circuit can be readily designed.

The novel features which are considered characteristic of this invention are set forth in the appended claims. This invention itself, however, as well as other objects and advantages thereof will be best understood by reference to the following detailed description of an illustrative embodiment, when read in conjunction with the accompanying drawings.

DETAILED DESCRIPTION OF THE INVENTION

Figure 1:
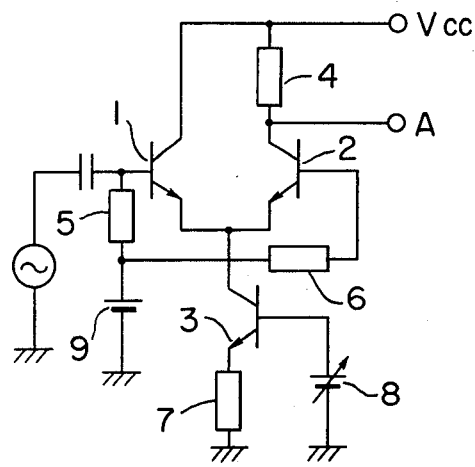
FIG. 1 is a circuit diagram showing a conventional differential amplifier circuit.
Figure 2:
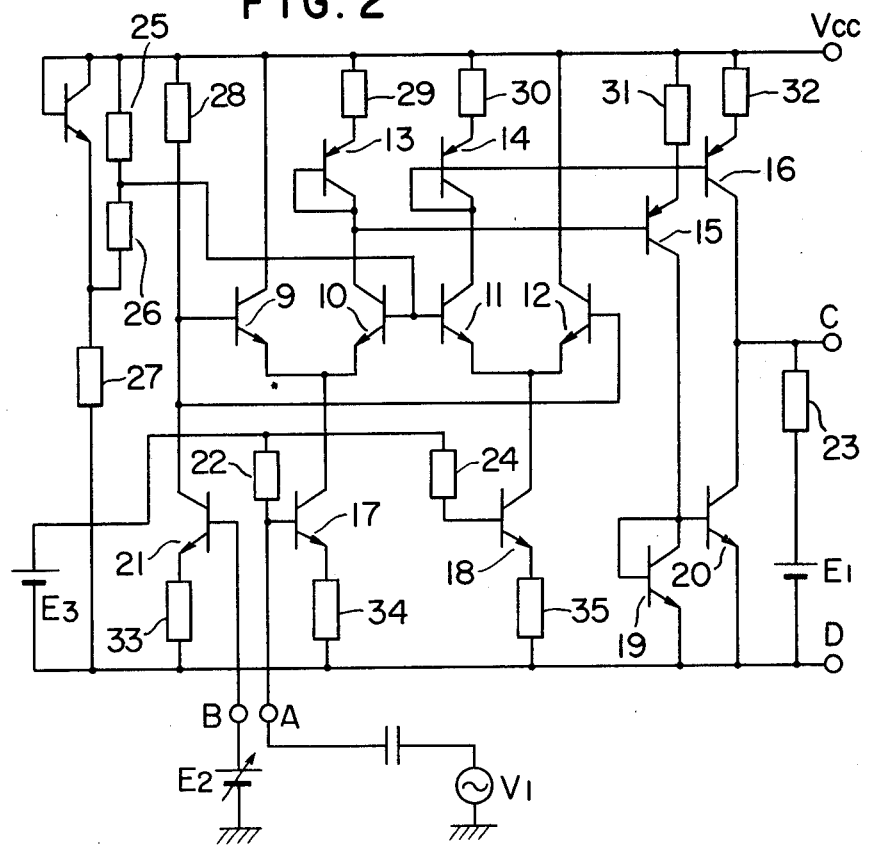
FIG. 2 is a circuit diagram showing one example of a transistor amplifier circuit according to this invention.

FIG. 2 is a circuit diagram showing on example of a transistor amplifier circuit according to this invention. In FIG. 2, transistors 9 and 10 form a first differential amplifier, transistor 17 is a first current source transistor, transistors 11 and 12 form a second differential amplifier, and transistor 18 is a second current source transistor. Thus a double balance type cascade amplifier is formed. The bases of the transistors 10 and 11 in the first and second differential amplification stages are connected together and are further connected to the connection point between a resistor 25 and a resistor 26. Resistor 26 is further connected to a resistor 27, so that a reference voltage is applied to the commonly connected bases of the transistors 10 and 11 through a voltage divider formed by these resistors. A variable voltage (or a gain control voltage) is supplied from a variable DC voltage source $E_2$ to the base of a transistor 21, so that a variable voltage is applied to the commonly connected bases of the transistors 9 and 12; that is, a variable voltage is applied to the first and second differential amplification stages. A DC voltage is applied from a bias voltage source $E_3$ to the first and second current source transistors 17 and 18 through respective resistors 22 and 24. An AC voltage $V_1$ is applied to the transistor 17 through terminal A.

The transistors 10 in the first differential amplification stage is provided with a current mirror circuit consisting of transistors 13 and 15 and transistor 11 in the second differential amplifier stage is provided with a current mirror circuit consisting of transistors 14 and 16, respectively. The collector of the current mirror circuit transistor 15 is connected to a diode-connected transistor 19 (having its base and the collector connected together) forming a grounded-emitter circuit. The collector of the transistor 16 is connected to the collector of a transistor 20 which is diode-biased by the diode-connected transistor 19. One terminal of resistor 23 is connected to the connection point of the transistors 16 and 20. While the other terminal is connected to one terminal of a DC voltage source $E_1$ the other terminal of which is grounded. The collector currents of the transistors 10 and 11 set the collector currents of the respective transistors 15 and 16 by means of the current mirror circuits, which are delivered to a constant current source circuit made up of the transistors 19 and 20. Thus, a so-called current attracting circuit is provided. The output circuit described above is added to the double balance type cascade amplifier.

The output of the double balance type cascade amplifier thus organized is provided at the connection point of the transistors 16 and 20; that is, the output between terminals C and D is the sum of the voltage of the DC voltage source $E_1$ and the voltage drop across resistor 23. Resistors 29, 30, 31 and 32 are equal to one another in resistance, and the transistors 13, 14, 15 and 16 have the same electrical characteristics.

The operation of the double balance type cascade amplifier shown in FIG. 2 will be described. A reference voltage is applied through the voltage divider to the common base connection of the transistors 10 and 11 in the first and second differential amplification stages. The transistor 21 is biased by the variable DC voltage source $E_2$ so as to develope a voltage between resistors 28 and 33, which is applied to the common base connection of the transistors 9 and 12 in the first and second differential amplification stages. As a result, in the first and second differential amplification stages, the transistors 9 and 12 are rendered non-conductive (off), while the transistors 10 and 11 are rendered conductive (on). The current source transistors 17 and 18 are cascade-connected to the first and second differential amplification stages, and are biased through the resistors 22 and 24 by the bias voltage source $E_3$. The AC voltage $V_1$ is applied to the base of the transistor 17 in such a manner that it is superposed on the bias voltage $E_3$.

The current components of the double balance type cascade amplifier will be described. If the DC component of the collector current of the transistor 10 is represented by $I_0$ and resistor 34 has a resistance represented by $R_{34}$", then when the AC voltage $V_1$ is applied to the base of the transistor 17 an AC current of $\pm V_1/R_{34}$ flows through resistor 34, and therefore the total collector current of the transistor 17 can be expressed by $I_0 \pm V_1/R_{34}$. Only the DC current component is allowed to differentially flow in the transistors 10 and 11 in the second differential amplification stage. The collector current of the transistor 10 controls the collector current of the transistors 15 by means of the current mirror circuit made up of the transistors 13 and 15. Similarly, the collector current of transistor 11 controls the collector current of transistor 16 through the current mirror circuit including transistors 14 and 16. These mirror currents are delivered to the current attracting circuit constituted by the transistors 19 and 20. The junction of the transistors 16 and 20 is connected to a resistor 23 which is further connected to the DC stabilization voltage source $E_1$.

The mirror current that is the sum $I_0 \pm V_1/R_{34}$ of the DC component and the AC component flows through the transistor 15, and the mirror current that is the DC component $I_0$ flows through in the transistor 16. As such mirror currents are delivered to the constant current sources which are made up of the current mirror circuits, the variation component of the AC current $\pm V_1/R_{34}$ is injected through the resistor 23 from the DC voltage source $E_1$. The operation of the circuit will be described with reference to currents indicated in FIG. 2. A signal current of $\pm \Delta i$ superposed on the DC current $I_0$ flows into the first differential amplifier. This output current sets the collector current of the transistor 15 as $I_0 \pm \Delta i$ by means of the current mirror circuit consisting of the transistors 13 and 15. The DC current $I_0$ equivalent to the output current of the first differential amplifier flows into the second differential amplifier, and sets the collector current of the transistor 16 to $I_0$ by means of the transistors 14 and 16 forming a current mirror circuit. The outputs of the double balance type cascade amplifier, which are supplied through the current mirror circuits, are applied to the constant current source circuit, which is a current mirror circuit employing the transistors 19 and 20. The transistor 15 supplies a current of $I_0 \pm \Delta i$ from its collector to the common connection of the base and collector of transistor 19 and the base of transistor 20. Due to the current mirror action of the circuit including transistors 19 and 20, transistor 20 has a collector current of $I_0 \pm \Delta i$. At the same time transistor 16 supplies a current of $I_0$ from its collector to the collector of transistor 20. Therefore, a signal current of $\pm \Delta i$ flows through the resistor 23 from the DC stabilization voltage source $E_1$, as a result of which a voltage of $\pm \Delta i \cdot R_{23}$ is developed across the resistor 23, where $R_{23}$ is the resistance of the resistor 23. Thus, the output voltage $E_{CD}$ developed across the terminals C and is expressed by the following equation:

$$E_{CD} = E_1 + (R_{23}/R_{34})V_1 \tag{1}$$

As is clear from the equation (1), the voltage gain is determined by the simple ratio of, the resistance of resistor 23 to the resistance of resistor 34. Therefore, it is readily understood that the circuit can be designed in the form of an integrated circuit.

In order to maintain the output of the double balance type cascade amplifier, or the voltage developed across the terminals C and D, constant independent of the variations of the AC voltage $V_1$ applied to the terminal A, control is made in such a manner as to decrease the voltage of the variable DC voltage source $E_2$ applied through the terminal B, that is, control is made so that the base potential of the transistors 9 and 12 is higher than the base potential of the transistors 10 and 11. The collector current of the transistor 17 flows through the transistors 9 and 10 and the collector current of transistor 18 flows through the transistors 11 and 12. The voltage gain Av in this case can be represented by the following equation (2):

$$Av = \frac{R_{23}}{R_{34}} \left( \frac{1}{1 + e^{\frac{V_c}{V_T}}} \right) \tag{2}$$

where $V_T = KT/q$
in which q: electron charge $1.6 \times 10^{-19}$(C)
K: Boltzmann's constant $1.38 \times 10^{-23}$(J/K)
T: absolute temperature (°X), and
$V_C =$ (Base potential of transistor 9) — (Base potential of transistor 10).

Thus, the control should be made so that the output voltage $E_{CD}$ is maintained constant with respect to the variations of the AC voltage $V_1$ applied through the terminal A. That is, the variable DC voltage $E_2$ is controlled. In this case, the operating point of the transistor 17 is not changed, and therefore the output voltage $E_{CD}$ developed across the terminals C and D is maintained unchanged at all times. In addition, even if the supply voltage Vcc is varied, the output obtained is stable because the output voltage $E_{CD}$ is determined by the DC stabilization voltage source $E_1$.

As is apparent from the above description, the double balance type cascade amplifier according to the invention is a differential amplifier in which the output of the first and second differential amplification stages are generated by means of the current mirror circuits and are grounded through the constant current source circuit, and the DC stabilization voltage source is connected to the current output of one of the current mirror circuits, so as to provide its output. According to the invention, because as the voltage gain ratio can be readily determined from the resistances of the resistors 23 and 34, the circuit can be readily designed. In addition to this, the output is stable over a wide range of gain from 50 dB to 70 dB and the frequency characteristic is excellent, when compared to those of the conventional differential amplifier or the conventional double balance type cascade amplifier. Furthermore, in the double balance type cascade amplifier according to the invention, a DC voltage source $E_1$ different from the supply voltage Vcc is provided in the output stage. Therefore, the operation of the amplifier is not affected by the variations of the supply voltage. For instance, even if the supply voltage is decreased to approximately 1.8 V, the amplifier can operate. Thus, the amplifier circuit according to the invention can be effectively applied to semiconductor integrated circuits.

In the above-described embodiment of the invention, npn transistors are employed in the differential amplification stages; however, it will be understood that the invention is not limited thereto or thereby. That is, the differential amplification stages may be formed with pnp transistors. In this case, it goes without saying that the current mirror circuits should be designed to correspond to the differential amplification stages formed with pnp transistors. It is obvious that the transistor amplifier circuit according to the invention can also be applied to modification circuits or the like.

What is claimed is:

1. A transistor amplifier circuit comprising:
    first and second gain controlled differential amplifier circuits, each for generating an output current including a dc bias current proportional to the gain thereof;
    a gain control means connected to said first and second differential amplifier circuits for jointly controlling the gain of said first and second differential amplifier circuits;
    an input means connected to said first differential amplifier circuit for having an input signal applied thereto and for causing said first differential amplifier circuit to generate said output current including a signal current proportional to the product of the gain and the input signal; and
    a difference means connected to said first and second differential amplifier circuits for producing an output signal proportional to the difference in output currents of said first and second differential amplifier circuits, said difference means comprising first, second and third current mirror circuits and an output stage, said first and second current mirror circuits being for leading output currents of said first and second differential amplifier circuits to said third current mirror circuit and for applying mirror currents of said first and second current mirror circuits to said third current mirror circuit and said output stage including a dc stabilization power source for supplying a current to said third current mirror circuit from said dc stabilization power source to produce said output signal which is independent of output currents of said first and second differential amplifier circuits.

2. A transistor double balance type cascade amplifier circuit having circuits for producing an output voltage free of dc bias, comprising;
    first and second gain controlled differential amplifier circuits, each for generating an output current including a dc bias current proportional to the gain thereof;
    an input means connected to said first differential circuit for having an input signal applied thereto and for causing said first differential amplifier circuit to generate said output current including a signal current proportional to the product of the gain and the input signal;
    a controlled current generation circuit having a current control terminal and an output terminal for causing an output current to flow through said output terminal equal to the current applied to said current control terminal;
    a first current mirror circuit connected to said first differential amplifier circuit and said controlled current generation circuit, for applying a current equal to said current generated by said first differential amplifier circuit to said current control terminal of said controlled current generation circuit;
    a second current mirror circuit connected to said second differential amplifier circuit and said controlled current generation circuit, for applying a current equal to said current generated by said second differential amplifier circuit to said output terminal of said controlled current generation circuit; and
    said controlled current generation circuit having a third current mirror circuit, an output means including a dc stabilization power source having a first terminal connected to ground and a second terminal connected to said output terminal of said controlled current generation circuit, for applying a current equal to said signal current of said first differential amplifier circuit to said output terminal of said controlled current generation circuit, whereby said output voltage free of dc bias comprises the voltage across said output means.

3. A transistor double balance type cascade amplifier as claimed in claim 2, wherein;
    said first differential amplifier circuit includes a current source transistor, and an emitter resistor connected between the emitter electrode of said current source transistor and ground;
    said input means comprises means for applying the input signal to the base electrode of said current source transistor of said first differential amplifier circuit; and
    said output means further includes an output resistor connected between said dc stabilization power source and said output terminal of said controlled current generation circuit, whereby said output voltage free of dc bias satisfies the following equation:

$$E_O = E_1 \pm (R_1/R_2)V_1$$

wherein, $E_0$ is the output voltage free of dc bias, $E_1$ is the voltage of said dc stabilization power source, $V_1$ is the voltage of the input signal, $R_1$ is the resistance of said output resistor and $R_2$ is the resistance of said emitter resistor.

4. A transistor double balance type cascade amplifier circuit for producing an output voltage free of dc bias, comprising:
    first and second differential amplifier circuits, each comprising first and second differential transistors having commonly connected emitter electrodes and a current source transistor having a collector electrode connected to said commonly connected emitter electrodes of said first and second differential transistors;
    a reference voltage source connected in common to the base electrodes of said first transistors of both said first and said second differential amplifier circuits for applying a predetermined reference voltage to said base electrodes of said first transistors;

a gain control voltage source connected in common to the base electrodes of said second transistors of both said first and said second differential amplifier circuits for applying a controllable gain control voltage to said base electrodes of said second transistors;

a dc bias voltage source connected to the base electrodes of said current source transistors of both said first and said second differential amplifier circuits, for applying a predetermined dc bias voltage to said base electrodes of said current source transistors for causing said first and second differential amplifier circuits to generate a predetermined bias current;

a signal voltage input means connected to said base electrode of said current source transistor of said first differential amplifier, for applying a signal voltage to said base electrode of said current source transistor of said first differential amplifier circuit for causing said first differential amplifier circuit to generate a current equal to the sum of said predetermined bias current and a signal current proportional to said signal voltage;

a controlled current generation circuit having a current control terminal connected to said first differential amplifier circuit for receiving said current generated thereby and an output terminal connected to said second differential amplifier circuit for receiving said current generated thereby, for causing an output current to flow through said output terminal equal to said current received by said current control terminal;

a dc stabilization power source having a first terminal connected to ground and a second terminal; and an output resistor connected between said second terminal of said dc stabilization power source and said output terminal of said controlled current generation circuit for conducting a current equal to said signal current of said first differential amplifier circuit from said dc stabilization power source to said controlled current generation circuit, whereby the voltage across the combination of said output resistor and said dc stabilization power source comprises said output voltage free of dc bias.

* * * * *